(12) United States Patent
Alvarez et al.

(10) Patent No.: US 8,431,972 B2
(45) Date of Patent: Apr. 30, 2013

(54) SEMICONDUCTOR ESD DEVICE AND METHOD OF MAKING SAME

(75) Inventors: David Alvarez, Essex, VT (US); Richard Lindsay, Fishkill, NY (US); Manfred Eller, Wappingers Falls, NY (US); Cornelius Christian Russ, Diedorf (DE)

(73) Assignee: Infineon Technologies AG, Neubiberg (DE)

( * ) Notice: Subject to any disclaimer, the term of this patent is extended or adjusted under 35 U.S.C. 154(b) by 1013 days.

(21) Appl. No.: 11/638,067

(22) Filed: Dec. 13, 2006

(65) Prior Publication Data

US 2008/0142849 A1 Jun. 19, 2008

(51) Int. Cl.
*H01L 29/66* (2006.01)

(52) U.S. Cl.
USPC .......................................... 257/285; 257/655

(58) Field of Classification Search .................. 257/285, 257/655
See application file for complete search history.

(56) References Cited

U.S. PATENT DOCUMENTS

| | | | |
|---|---|---|---|
| 5,631,485 A * | 5/1997 | Wei et al. | 257/344 |
| 5,744,841 A | 4/1998 | Gilbert et al. | |
| 6,060,345 A * | 5/2000 | Hause et al. | 438/199 |
| 6,420,761 B1 | 7/2002 | Gauthier, Jr. et al. | |
| 6,433,392 B1 | 8/2002 | Amerasekera et al. | |
| 6,909,149 B2 * | 6/2005 | Russ et al. | 257/355 |
| 6,998,685 B2 | 2/2006 | Manna et al. | |
| 2005/0048724 A1 * | 3/2005 | Kao | 438/275 |

OTHER PUBLICATIONS

Hook, T. B., et al., "Titanium Silicide/Silicon Nonohmic Contact Resistance for NFET's, PFET's, Diffused Resistors, and NPN's in BiCMOS Technology," IEEE Transactions on Electron Devices, pp. 697-703, vol. 42, No. 4, Apr. 1995, IEEE.

* cited by examiner

Primary Examiner — Jae Lee
(74) Attorney, Agent, or Firm — Slater & Matsil, L.L.P.

(57) ABSTRACT

An ESD protection device includes a semiconductor body, a gate formed over a channel in the semiconductor body, the channel being doped with a first concentration of dopants of a first conductivity type. A first source/drain region is formed on the surface of the semiconductor body adjacent to a first edge of the gate, wherein the first source/drain region is doped with a dopant of a second conductivity type opposite the first conductivity type, and at least a portion of the first source/drain region is doped with a dopant of the first conductivity type. The concentration of the second conductivity type dopant exceeds the concentration of the first conductivity type dopant, and the concentration of the first conductivity type dopant in the first source/drain exceeds the first concentration. A second source/drain region is also formed at the upper surface of the semiconductor body adjacent to a second edge of the gate, wherein the second source/drain region is doped with a dopant of the second conductivity type.

24 Claims, 4 Drawing Sheets

SEMICONDUCTOR ESD DEVICE AND METHOD OF MAKING SAME

TECHNICAL FIELD

This invention relates generally to semiconductor devices, and more particularly to an ESD protection device and method.

BACKGROUND

As electronic components are getting smaller and smaller along with the internal structures in integrated circuits, it is getting easier to either completely destroy or otherwise impair electronic components. In particular, many integrated circuits are highly susceptible to damage from the discharge of static electricity. Electrostatic discharge (ESD) is the transfer of an electrostatic charge between bodies at different electrostatic potentials (voltages), caused by direct contact or induced by an electrostatic field. The discharge of static electricity, or ESD is a critical problem for the electronics industry.

Device failures that result from ESD events are not always immediately catastrophic or apparent. Often, the device is only slightly weakened but is less able to withstand normal operating stresses and, hence, may result in a reliability problem. Therefore, various ESD protection circuits must be included in the device to protect the various components.

When an ESD pulse occurs on a transistor, the extremely high voltage of the ESD pulse can break down the transistor and can potentially cause permanent damage. Consequently, the input/output pads of an integrated circuit need to be protected from ESD pulses so they are not damaged.

One of the issues faced with the design of ESD protection devices is the problem of localized high current in large parallel ESD devices. Ballast resistance is commonly used to reduce the amount of current that flows through a particular branch of an ESD device. By limiting the amount of ESD current that flows though a particular branch of an ESD device, the device as a whole will be able to handle more current before device failure. Ballasting provides a more uniform distribution of the current and therefore results in less current crowding and the failure current is increased. Such ballasting resistance is accomplished by creating separate resistance regions, or by using a silicide blocking mask to increase the drain resistance of the ESD device. Using separate ballasting resistors, however, increases the physical size of the ESD device which increases die cost, and blocking silicide requires an extra mask which increases the cost of a mask set. Silicide blocking also adds processing cost because of the extra processing step required. Thus there is a need for ESD protection structures with effective ballasting that are compact in area and avoid the cost of extra masks.

SUMMARY OF THE INVENTION

In one embodiment of the present invention, a semiconductor ESD protection device is disclosed which includes a semiconductor body, a gate formed over a channel in the semiconductor body, the channel being doped with a first concentration of dopants of a first conductivity type. A first source/drain region is formed on the surface of the semiconductor body adjacent to a first edge of the gate, wherein the first source/drain region is doped with a dopant of a second conductivity type opposite the first conductivity type, and at least a portion of the first source/drain region is doped with a dopant of the first conductivity type. The concentration of the second conductivity type dopant exceeds the concentration of the first conductivity type dopant, and the concentration of the first conductivity type dopant in the first source/drain exceeds the first concentration. A second source/drain region is also formed at the upper surface of the semiconductor body adjacent to a second edge of the gate, wherein the second source/drain region is doped with a dopant of the second conductivity type.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION

The making and using of the presently preferred embodiments are discussed in detail below. It should be appreciated, however, that the invention provides many applicable inventive concepts that can be embodied in a wide variety of specific contexts. The specific embodiments discussed are merely illustrative of specific ways to make and use the invention, and do not limit the scope of the invention.

The invention will be described with respect to preferred embodiments in a specific context, namely an NMOS ESD structure. The invention may also be applied, however, to other semiconductor structures. For example, concepts described herein can be applied to PMOS ESD structures, as well as other structures.

Figure 1:
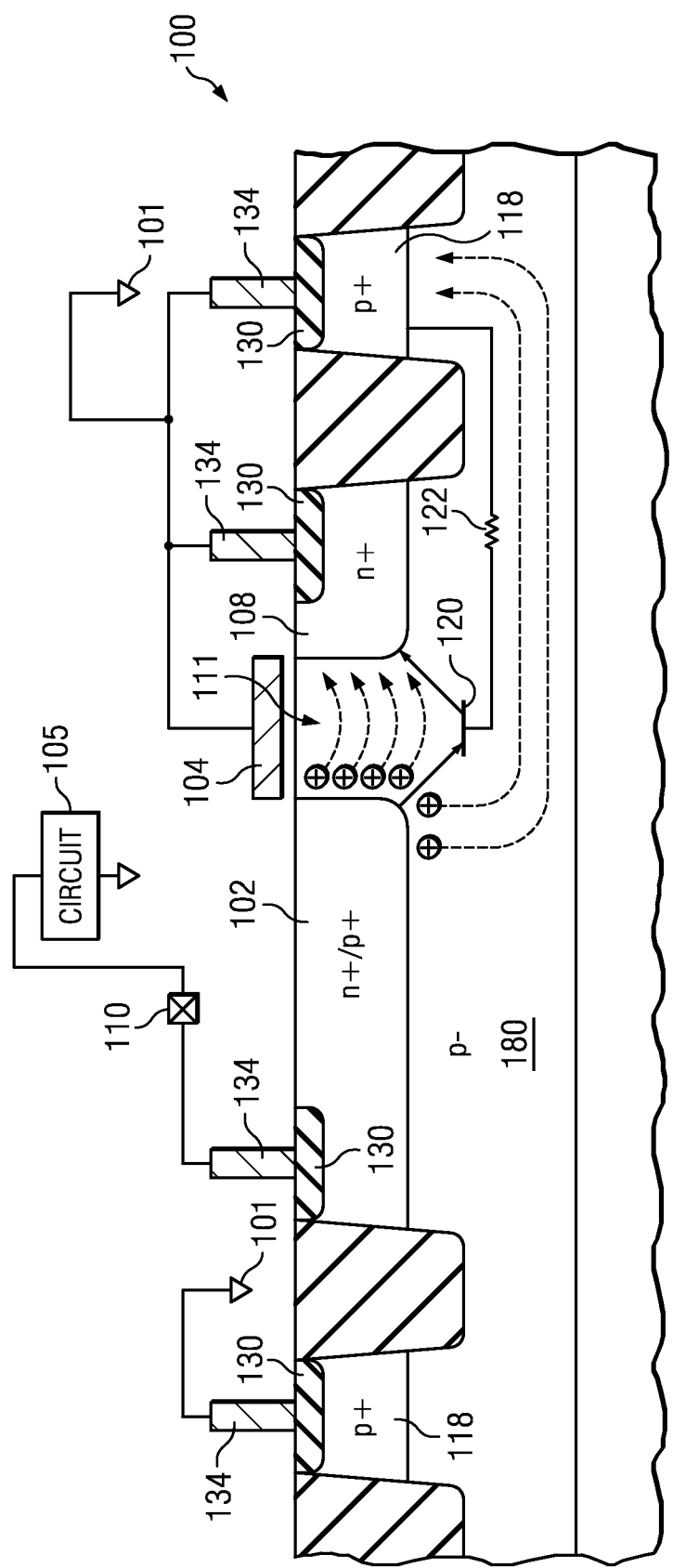
FIG. 1 is a cross sectional view of an ESD protection structure.

FIG. 1 illustrates an ESD protection device 100. This device includes an NMOS transistor with drain and source regions 102 and 108. A gate 104 overlies a channel region 111 between the source 108 and the drain 102. Bulk contact regions 118 are provided to allow electrical contact to the p-well region 140. Contacts 134 provide electrical contact to the doped regions 102, 108, and 118. Each of these contacts is formed over a silicide region 130. In the case of the drain region 102 and source region 108, the silicide region 130 does not extend over the entire doped region 102.

Typically the device is connected as shown in FIG. 1. An external pad 110 is connected to drain 102, while the gate 104, source 108 and substrate 118 are connected to ground 101. External pad 110 is coupled to a circuit 105 to be protected.

The structure of FIG. 1 is a silicide-blocked NMOS device. (A non-silicide block example is provided with respect to FIG. 3). Typical current flow lines are indicated at the snapback trigger point. Junction breakdown occurs at the junction sidewall (between drain 102 and p-well 140) and generated holes drift to the bulk contact regions 118 while turning on the parasitic bipolar transistor 120 (formed by n-region 102/p-region 111 and parts of p-well 140/n-region 108).

Figure 2:
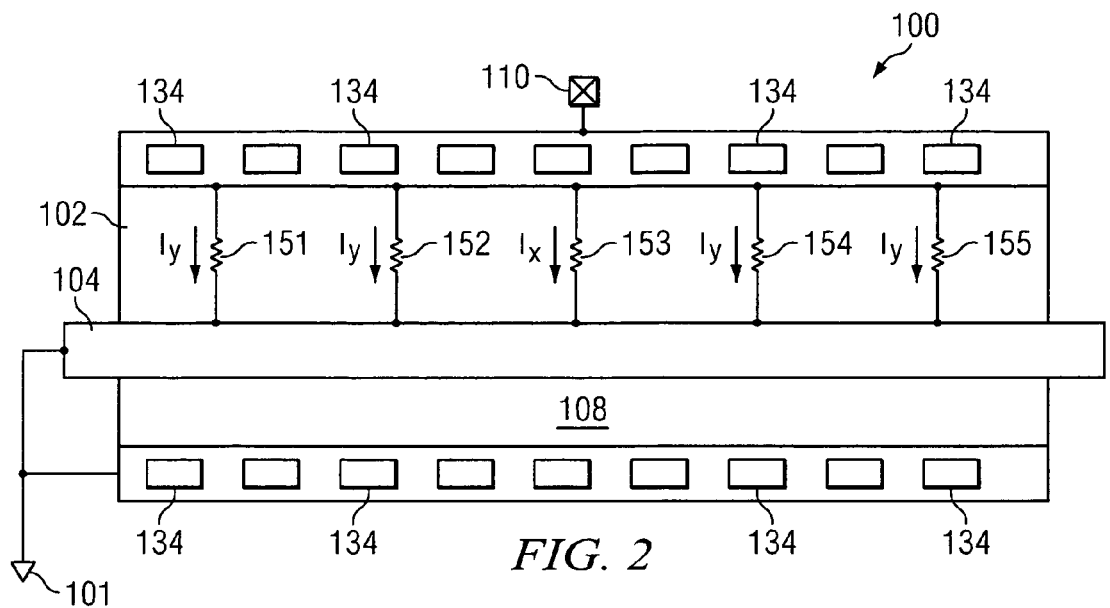
FIG. 2 is a layout view of an ESD structure.

One of the reasons why the silicide is blocked on the NMOS device 100 in FIG. 1 is to prevent hot spots in the ESD device during an ESD discharge event. FIG. 2 shows a layout view of an ESD NMOS device with the distributed resistance of the drain 102 modeled by distributed resistors 151/152/153/154/155. Ideally, the resistance of the drain is uniform and the strength of the device 100 uniform across the width of the gate. Any variation in drain resistance and device strength, however, will cause a larger amount of current to flow in the path of least resistance. For example, if parasitic resistor 153 is lower than the other parasitic resistors 151/152/154/155, current Ix through parasitic resistor 153 will be greater than the currents Iy which flow through the other parasitic resistors 151/152/154/155. If the parasitic resistance is too low and/or the parasitic resistance is non-uniformly distributed, the regions of the device which experience the highest currents may experience currents which exceed the maximum current density of the process, or the device's maximum current handling capability. In the case of an ESD event of a few thousand volts applied to pad 110, the current flow through the ESD device could be appreciable, typically several amps for a device with a width of 200 μm to 300 μm.

Ballasting will deal with the problem of non-uniformly distributed device strength. Ballasting is the inclusion of additional resistance in a high current path in order to limit localized current flow in the presence of high potentials. In the device 100 shown in FIG. 1, ballasting is achieved by blocking the low resistance silicide 130 and by making the drain 102 longer than the minimum length allowed by the process. Alternatively, ballasting can also be achieved by increasing the source resistance by blocking silicide or by making the source longer. Because the silicide 130 is blocked and because the drain is physically longer, the drain 102 resistance is higher and less current is prone to flow through weaker regions of the device 100 during an ESD event. The current distribution among the branches is more uniform, and device failure is less likely during an ESD event.

To enhance the ballasting effect, the embodiment of FIG. 1 includes a drain region 102 that has been counter-doped with p-type dopants. Counterdoping the drain will increase the resistance from the edge of gate 104 to the contact 134. By doing this the length of the drain 102 can be shortened thereby saving chip space and/or improving the current handling capability of the ESD device 100. Further, as discussed below, in certain embodiments, the silicide blocking mask can be avoided thereby saving an extra masking step.

A first embodiment example of fabrication will be described with respect to FIGS. 3a-3c. In this example, the silicide is not blocked. An example of fabricating a silicide blocked device as described with respect to FIG. 1 is then described with respect to FIGS. 4a-4b.

Figure 3A:
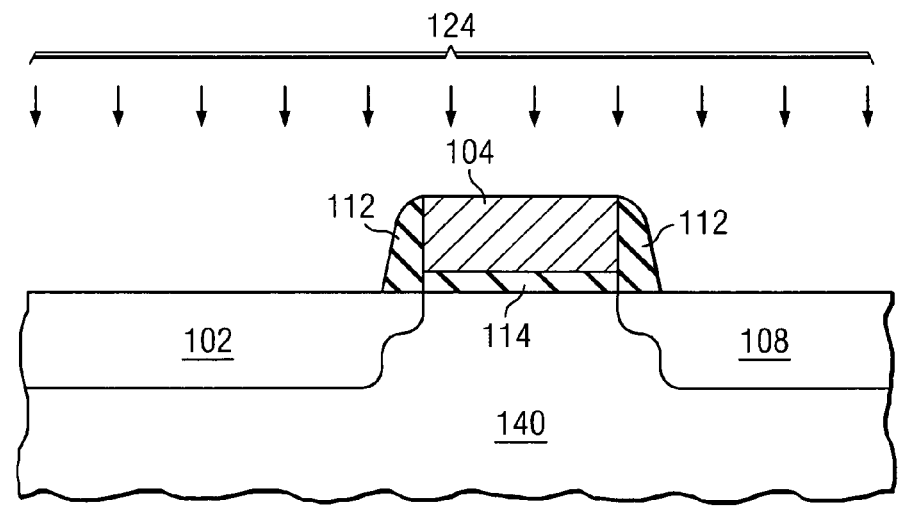
FIGS. 3a-3c are cross sectional views of the fabrication of a first embodiment ESD structure.
Figure 3B:
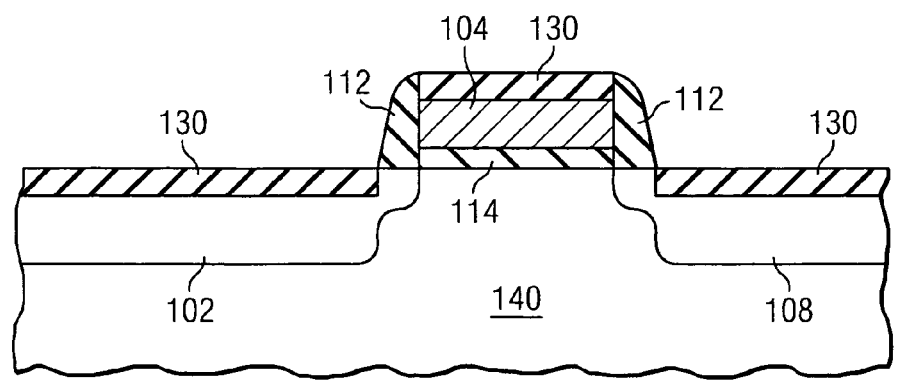
Figure 3C:
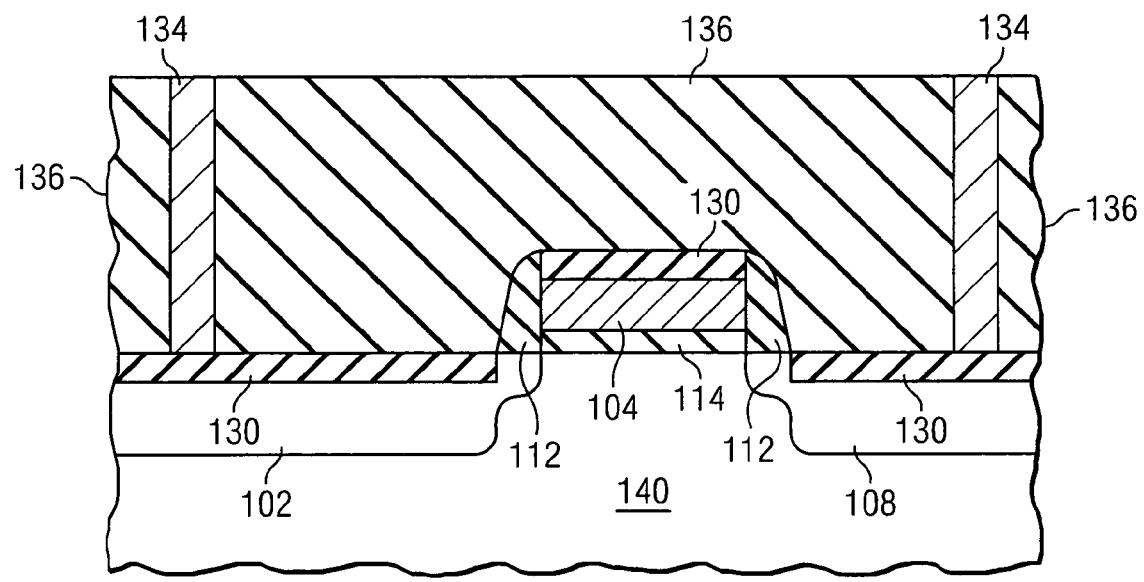

FIGS. 3a-3c show cross-sectional drawings of the fabrication of one embodiment process. In this embodiment of the present invention, the source/drain regions of the ESD devices are counter-doped with a dopant of the opposite polarity in order to increase the resistance of the source drain regions.

FIG. 3a shows a semiconductor body 140. A gate dielectric 114, a gate electrode 104, along with spacers 112 are formed over the semiconductor body 140.

The gate dielectric 114 may be deposited by chemical vapor deposition (CVD), thermally grown gate oxide, atomic layer deposition (ALD), metal organic chemical vapor deposition (MOCVD), physical vapor deposition (PVD), or jet vapor deposition (JVD), as examples. In other embodiments, the gate dielectric 24 may be deposited using other suitable deposition techniques. The gate dielectric 24 preferably comprises a thickness of about 10 Å to about 60 Å in one embodiment, although alternatively, the gate dielectric 114 may comprise other dimensions.

The gate electrode 104 is formed over the gate dielectric 114. The gate electrode 104 preferably comprises a semiconductor material, such as polysilicon or amorphous silicon, although alternatively, other semiconductor materials may be used for the gate electrode 104. In other embodiments, the gate electrode 104 may comprise TiN, HfN, TaN, W, Al, Ru, RuTa, TaSiN, NiSi$_x$, CoSi$_x$, TiSi$_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 104 comprises a doped polysilicon layer underlying a silicide layer (e.g., titanium silicide, nickel silicide, tantalum silicide, cobalt silicide, or platinum silicide).

The gate layer (and optionally the gate dielectric layer) are patterned and etched using known photolithography techniques to create the gate electrode 104 of the proper pattern. After formation of the gate electrodes, lightly doped source/drain regions can be implanted using the gate electrode 104 as a mask. Other implants (e.g., pocket implants, halo implants or double diffused regions) can also be performed as desired.

Spacers 112, which are formed from an insulating material such as an oxide and/or a nitride, can be formed on the sidewalls of the gate electrode 104. The spacers 112 are typically formed by the deposition of a conformal layer followed by an anisotropic etch. The process can be repeated for multiple layers, as desired.

FIG. 3a shows the device after it has been exposed to an ion implant step which forms the source/drain regions 108/102 of the transistor. In the first embodiment of the present invention, an n-type transistor is formed, and n-type ion implant is used to form the heavily doped source 108 and drain 102 regions. In the preferred embodiment, arsenic or phosphorus ions are implanted into the source/drain regions 108/102. For example, Arsenic ions can be implanted with a dose of about $10^{14}$ cm$^{-2}$ to about $5\times10^{15}$ cm$^{-2}$ and an implant energy between about 10 keV and about 40 keV. In other embodiments, other materials, such Phosphorous, can be implanted. In the first embodiment of the present invention, the n-type regions are defined using a particular mask, which will be referred to as the n+ mask in this specification.

In the first embodiment of the present invention, the source/drain regions 108/102 are also further doped with p-type material. A p-type ion implant 124 is used to counter-dope the source/drain 108/102 regions. For example, boron ions can be implanted with a dose of about $5\times10^{13}$ cm$^{-2}$ to about $3\times10^{15}$ cm$^{-2}$ and an implant energy between about 10 keV and about 40 keV. In other embodiments, other materials, such as Indium, can be implanted. In order for the NMOS ESD device to be functional, however, the n-type concentration should exceed the p-type concentration.

In one embodiment of the present invention, these p-type doped regions are defined in the same mask which defines the p-type doping regions for PMOS so that no additional mask is required to achieve the p-type doping in the n-type ESD regions as disclosed herein.

Referring to FIG. 3b, the source 108 and drain 102 regions are silicided to form low resistivity upper surface regions 130, respectively. Silicide is formed by first depositing a silicidation metal over the source and drain regions, then subjecting the silicon to an annealing process. In the preferred embodiment, the silicidation metal is nickel, but the metal could also be cobalt, copper, molybdenum, titanium, tantalum, tungsten, erbium, zirconium, platinum, or combinations thereof.

The semiconductor body 140 is then heated to about 600° C. or 700° C. to form a single layer of nickel silicide. During the silicidation process, the silicon and the metal form an alloy. The drain sheet resistance will be higher when created with counter-doped silicon than it would be if it were created with highly doped silicon.

In the embodiment of FIG. 3, unlike the embodiment of FIG. 1, the silicide layer 130 extends over the entire length of the drain region 108. An advantage of this process is that the silicide blocking mask (see FIG. 4) is avoided.

Figure 4A:
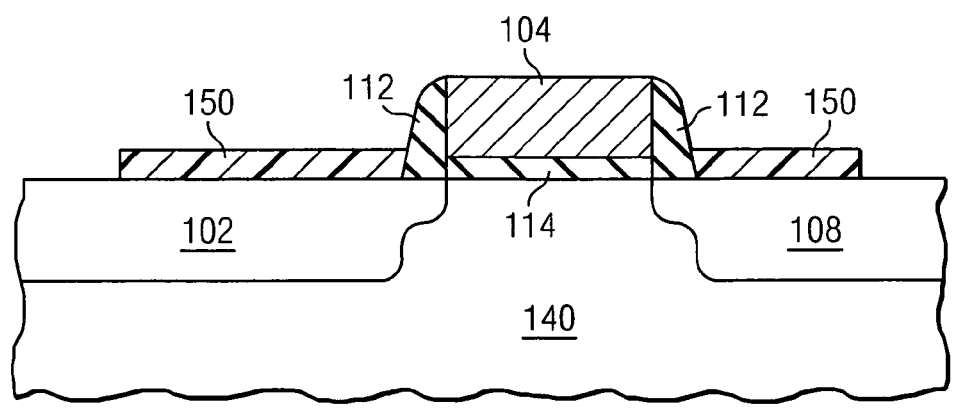
FIGS. 4a-4b are cross sectional views of a method of making a second embodiment ESD structure.
Figure 4B:
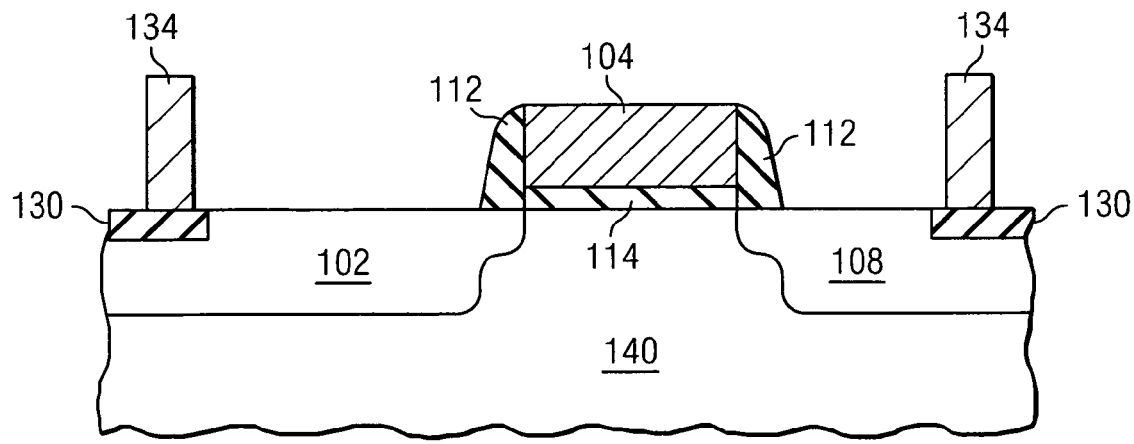

FIGS. 4a and 4b, a show cross-sectional view of a second embodiment of the present invention. Processing generally proceeds as described in FIGS. 3a-3c herein above, with the exception of having the silicide 130 blocked over the source 108 and drain 102 of the device. This blocking is accomplished by including a silicide blocking mask 150 (e.g., a nitride layer) over the places where no silicide is desired. Since the metal is not in contact with the silicon in region of the blocking mask 150, no silicide will be formed. The structure after silicidation is shown in FIG. 4b.

By counter-doping the source and drain of the device as well as blocking the silicide, a smaller drain length can yield an equivalent resistance as a longer drain length would in the first embodiment of the present invention. For example, the distance from the edge of the silicide drain contact 134 to the edge of the gate, hereafter called "drain length," can be between 0.5 µm and 5 µm for a 45 nm to 130 nm gate length device. For other devices, the ratio of the drain length to the gate length is typically between 1:1 and 200:1.

Figure 5:
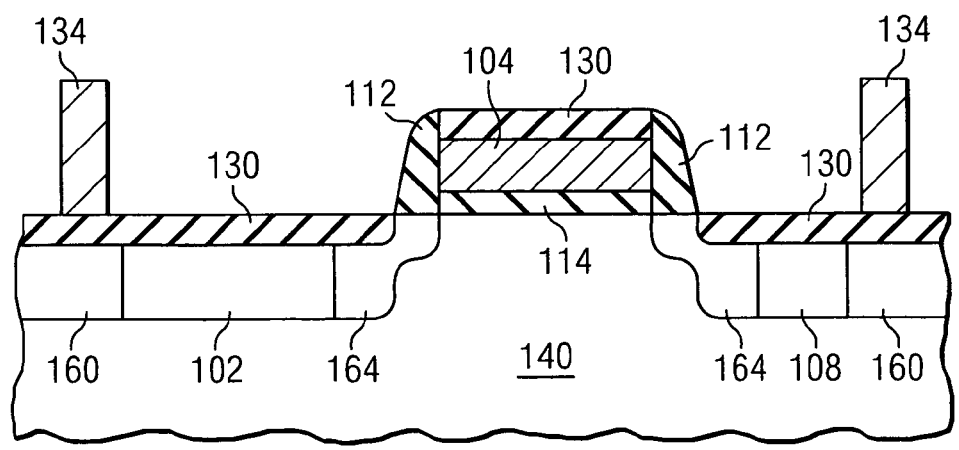
FIG. 5 is a cross sectional view of a third embodiment ESD structure.

FIG. 5 shows a cross-sectional view of a third embodiment of the present invention. Processing generally proceeds as described in FIGS. 3a-3c herein above, with the exception of creating three doped regions in the source 108 and drain 102 regions. The source 108 and drain 102 regions are doped and counter-doped as described herein above, but the regions 160 under the contacts 134 and the regions 164 adjacent to the gate 104 are not counter-doped.

In the third embodiment, non-counter-doped regions 164 between 20 nm and 200 nm, typically between 50 nm and 100 nm, are created adjacent to the gate. Between 50 nm and 100 nm non-counter-doped regions are created that extend beyond the edge of the contact. For example, in the third embodiment, when an NMOS ESD is fabricated, regions 160 and 164 will be highly doped n+ regions, but regions 102 and 108 will be higher resistivity n+/p+ regions which have been counter-doped. In this embodiment, the three doping regions are achieved by opening up the p+ mask only over the regions 102 and 108 that will be counter doped.

By leaving a non-counter-doped region 160 under the contacts 134, the contact resistance will not be increased with respect to a conventional art ESD protection device, and by leaving a non-counter-doped region adjacent to the gate 104, the trigger voltage of the ESD will not be shifted with respect to the trigger voltage of a conventional art ESD device.

In the embodiments of the invention presented herein, an NMOS ESD device is fabricated. In other embodiments of the present invention, a PMOS ESD device could be fabricated using the concepts described herein, provided that the concentration of the p-type dopant exceeds the concentration of the n-type dopant in the counter-doped regions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
a semiconductor body;
a gate formed over a channel in the semiconductor body, the channel being doped with a first concentration of dopants of a first conductivity type;
a first source/drain region formed on a surface of the semiconductor body adjacent to a first edge of the gate, wherein the first source/drain region is doped with a dopant of a second conductivity type opposite the first conductivity type, and a first portion of the first source/drain region is counter-doped with a counter-dopant of the first conductivity type, wherein
the first portion of the first source/drain region does not extend to a region adjacent to the first edge of the gate,
a concentration of the second conductivity type dopant exceeds a concentration of the first conductivity type counter-dopant in the first portion of the first source/drain region, and
the concentration of the first conductivity type counter-dopant in the first portion of the first source/drain region exceeds the first concentration; and
a second source/drain region formed at an upper surface of the semiconductor body adjacent to a second edge of the gate, wherein the second source/drain region is doped with the dopant of the second conductivity type.

2. The semiconductor device of claim 1, wherein a first portion of the second source/drain region is counter-doped with the counter-dopant of the first conductivity type, and wherein the concentration of the second conductivity type dopant exceeds the concentration of the first conductivity type counter-dopant in the first portion of the second source/drain region.

3. The semiconductor device of claim 1, wherein the first source/drain region has a length that is longer than a length of the second source/drain region.

4. The semiconductor device of claim 1, the device further comprising:
a first silicided region disposed over at least a portion of the first source/drain region; and
a second silicided region disposed over at least a portion of the second source/drain region.

5. The semiconductor device of claim 4, wherein the first silicided region does not extend over the first portion of the first source/drain region.

6. The semiconductor device of claim 5, wherein the first silicided region over the first source/drain region extends over the first portion of the first source/drain region.

7. The semiconductor device of claim 4, wherein the first silicided region extends over the entire first source/drain region and the second silicided region extends over the entire second source/drain region.

8. The semiconductor device of claim 4, the device further comprising:
a first source/drain contact electrically coupled to the first silicided region over the first source/drain region; and
a second source/drain contact electrically coupled to the second silicided region over the second source/drain region.

9. The semiconductor device of claim 8, wherein:
the first portion of the first source/drain region does not extend under the first source/drain contact.

10. The semiconductor device of claim 1, wherein the gate, first source/drain region and second source/drain region form an ESD protection device.

11. The semiconductor device of claim 10, wherein the ESD protection device is an NMOS device and wherein the first conductivity type is p-type and the second conductivity type is n-type.

12. The semiconductor device of claim 10, wherein the ESD protection device is a PMOS device and wherein the first conductivity type is n-type and the second conductivity type is p-type.

13. An ESD protection device comprising:
a semiconductor body;
a gate disposed over a channel in the semiconductor body, the channel being doped with a dopant of a first conductivity type;
a source region and drain region, wherein the source region and drain region are doped with a dopant of a second conductivity type opposite the first conductivity type, and a first portion of the source region and a first portion of the drain region is counter-doped with a counter-dopant of the first conductivity type, wherein a second portion of the source region and a second portion of the drain region directly adjacent to edges of the gate are not counter-doped with the counter-dopant of the first conductivity type, and wherein a concentration of the second conductivity type dopant exceeds a concentration of the first conductivity type counter-dopant in the first portion of the source region and in the first portion of the drain region;
a circuit to be protected, the circuit being electrically coupled to the drain region; and
a low impedance reference voltage connection, the low impedance reference voltage connection being electrically coupled to the source region and gate region.

14. The ESD protection device of claim 13, wherein the source and drain are formed in a well region, the well region electrically coupled to the low impedance reference voltage connection.

15. The ESD protection device of claim 14, further comprising a well contact region disposed in the semiconductor body and spaced from the source and/or the drain by an isolation region, the well contact coupled to the low impedance reference voltage connection.

16. The ESD protection device of claim 13, the device further comprising a first silicided region overlying a portion of the source region and a second silicided region overlying a portion of the drain region.

17. The ESD protection device of claim 16, wherein the first silicided region does not extend over the first portion of the source region, and does not extend over the first portion of the drain region.

18. The ESD protection device of claim 16, wherein the first silicide region overlies the entire source region and the second silicide region overlies the entire drain region.

19. The ESD protection device of claim 13, wherein portions of the source region and drain region underneath a source contact and a drain contact are not counter-doped with the counter-dopant of the first conductivity type.

20. The ESD protection device of claim 13, wherein the first conductivity type comprises a p-type, and the second conductivity type comprises n-type.

21. The ESD protection device of claim 20, wherein the ESD protection device comprises an NMOS device.

22. The ESD protection device of claim 13, wherein the low impedance reference voltage connection comprises a ground connection.

23. The semiconductor device of claim 9, wherein the first silicided region extends over the entire first source/drain region and the second silicided region extends over the entire second source/drain region.

24. The semiconductor device of claim 1, further comprising a circuit to be protected coupled to the first source/drain region.

* * * * *